(12) United States Patent
Oyasato et al.

(10) Patent No.: US 8,014,188 B2
(45) Date of Patent: Sep. 6, 2011

(54) ELECTRIC ELEMENT, SWITCHING ELEMENT, MEMORY ELEMENT, SWITCHING METHOD AND MEMORY METHOD

(75) Inventors: Yumiko Oyasato, Yokohama (JP); Hideyuki Nishizawa, Tokyo (JP); Kenji Sano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 12/408,072

(22) Filed: Mar. 20, 2009

(65) Prior Publication Data

US 2010/0124096 A1 May 20, 2010

(30) Foreign Application Priority Data

Nov. 18, 2008 (JP) ................................. 2008-294112

(51) Int. Cl.
*G11C 11/00* (2006.01)
(52) U.S. Cl. .......................... 365/148; 365/113; 365/163
(58) Field of Classification Search .................. 365/148, 365/113, 151, 163
See application file for complete search history.

(56) References Cited

U.S. PATENT DOCUMENTS

| 7,615,439 | B1 * | 11/2009 | Schricker et al. | 438/237 |
| 2006/0186451 | A1 * | 8/2006 | Dusberg et al. | 257/306 |
| 2007/0045667 | A1 * | 3/2007 | Lieber et al. | 257/211 |
| 2007/0161237 | A1 * | 7/2007 | Lieber et al. | 438/674 |
| 2008/0070162 | A1 | 3/2008 | Ufert | |
| 2010/0008123 | A1 * | 1/2010 | Scheuerlein | 365/148 |

FOREIGN PATENT DOCUMENTS

JP 2008-166591 7/2008

OTHER PUBLICATIONS

"Electrochemistry", The Electrochemical Society of Japan, vol. 75, No. 4, Apr. 2007, pp. 370-373.

* cited by examiner

*Primary Examiner* — Gene N. Auduong
(74) *Attorney, Agent, or Firm* — Oblon, Spivak, McClelland, Maier & Neustadt, L.L.P.

(57) ABSTRACT

An electric element includes a pair of electrodes; and a plurality of carbon nanotubes of three-dimensional network structure which are located between the pair of electrodes. The electric element can be applied for a memory element and the like.

11 Claims, 5 Drawing Sheets

ELECTRIC ELEMENT, SWITCHING ELEMENT, MEMORY ELEMENT, SWITCHING METHOD AND MEMORY METHOD

CROSS-REFERENCE TO RELATED APPLICATIONS

This application is based upon and claims the benefit of priority from the prior Japanese Patent Application No. 2008-294112, filed on Nov. 18, 2008; the entire contents of which are incorporated herein by reference.

BACKGROUND OF THE INVENTION

1. Field of the Invention

The present invention relates to an electric element, a switching element, a memory element, a switching method and a memory method.

2. Description of the Related Art

Electronic memories commercially available contain respective bistable elements configured so as to be switched from a state of high resistance to a state of low resistance or from a state of low resistance to a state of high resistance when electric potential is applied to the electronic memories. Such an electronic memory as described above is usually called as a "resistance memory device". In the resistance memory device, since the resistance of the resistance memory device is varied in accordance with an electric potential to be applied, data are allocated to the respective resistances and thus, stored so as to function as a memory element.

It is well known that chalcogenide materials, semiconductor materials, oxides, nitrides and organic materials can exhibit respective resistive memory properties. A resistive memory device containing the material as described above has some disadvantages of high operating voltage and current, poor resistance and poor handling of the material (which is utilized as a thin film). Recently, the disadvantages of the resistance memory device can be overcome through the drastic development of material engineering so that attention is paid to the resistance memory device as a multi-bit operating memory of nonvolatile, low electric power consumption and high density recording. As the resistance memory device can be exemplified a Phase Change RAM (PRAM), an organic memory and an Oxide Resistive RAM.

In the case of the organic memory as an example, an organic memory layer is formed between a top electrode and a bottom electrode and memory cells are arranged at the cross points of the top electrode and the bottom electrode. As a result, the organic memory is formed in matrix shape.

A typical resistive memory device has two resistance states of low resistance setting state and high resistance resetting state. Therefore, if data "1" is allotted to the low resistance state and data "0" is allotted to the high resistance state, two data logic state can be stored in the resistance memory device. The two states of low resistance state and high resistance state can be switched by applying a voltage or current to the resistive memory device. The voltage or current to be required to switch from one state (e.g., high resistance state) to the other state (e.g., low resistance state) is defined as a "switching window".

At present, it is difficult for a metallic oxide resistance memory or an organic memory to ensure the switching window. With the organic memory, since the operating voltage fluctuation is large, it becomes much difficult to ensure the switching window.

In this way, in the resistive memory device, if the difference (i.e., switching window) between the voltage (or current) to induce the setting state and the voltage (or current) to induce the resetting state can not be ensured sufficiently, the operating reliability of the resistive memory device can not be realized. However, it is difficult for a conventional resistive memory device to ensure the switching window so as to lower the operating reliability of the resistive memory device.

SUMMARY OF THE INVENTION

It is an object of the present invention to provide an electric element newly configured so as to easily ensure a switching window and thus, to be usable as a resistive memory device and another electric element.

In order to achieve the above object, an aspect of the present invention relates to an electric element, including: a pair of electrodes; and a plurality of carbon nanotubes of three-dimensional network structure which are located between the pair of electrodes.

According to the aspect of the present invention can be provided an electric element newly configured so as to easily ensure a switching window and thus, to be usable as a resistive memory device and another electric element.

DESCRIPTION OF THE EMBODIMENTS (Electric Element and Principle of Electric Element)

Figure 1:
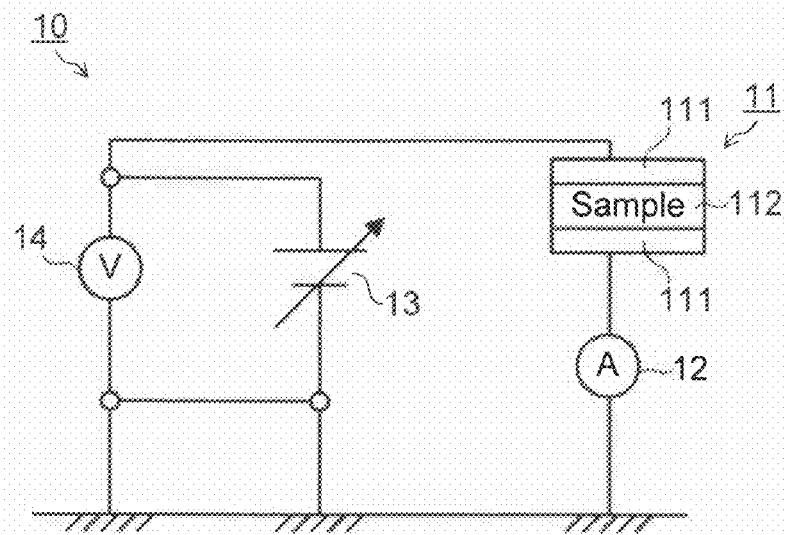
FIG. 1 is a structural view showing a circuit system including an electric element according to an embodiment.
Figure 2:
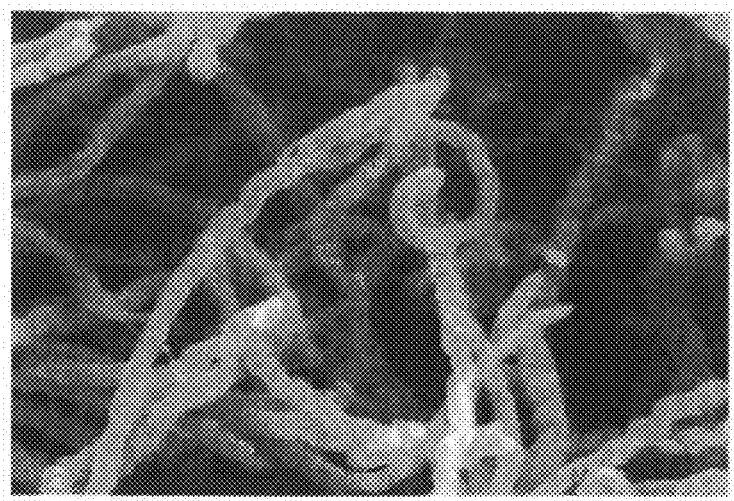
FIG. 2 is a SEM photograph showing the structure of carbon nanotubes constituting an electric element according to an embodiment.
Figure 3:
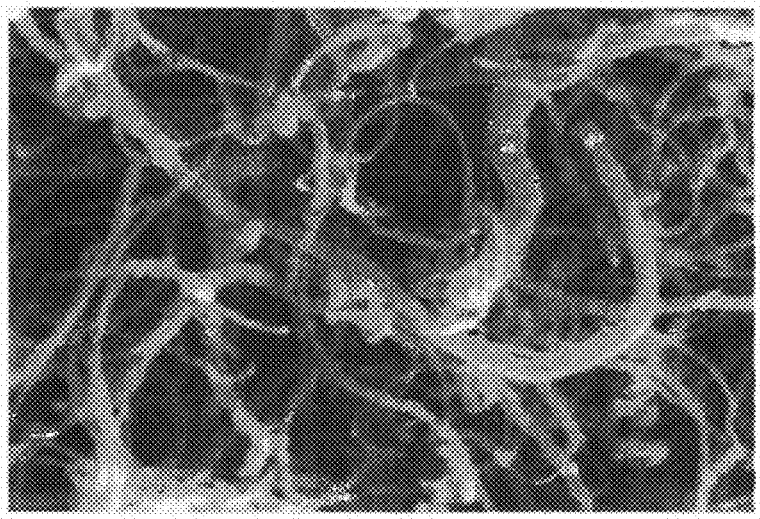
FIG. 3 is a SEM photograph showing the structure of carbon nanotubes constituting an electric element according to an embodiment.
Figure 4:
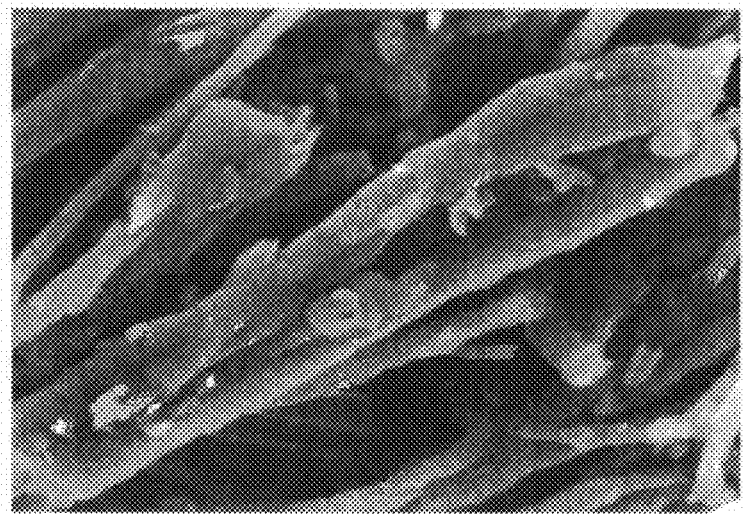
FIG. 4 is a SEM photograph showing the structure of carbon nanotubes constituting an electric element according to an embodiment.
Figure 5:
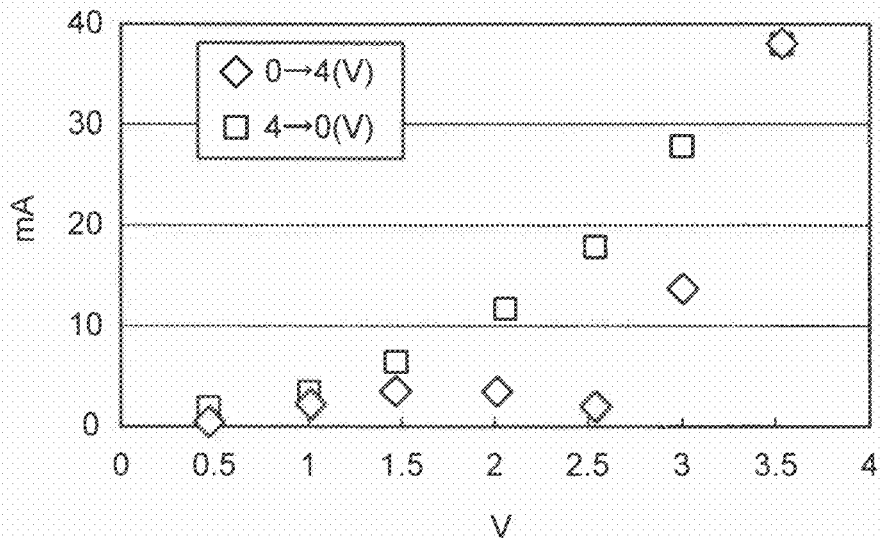
FIG. 5 is a graph showing a current-voltage characteristics of a circuit system including an electric element according to an embodiment.
Figure 6:
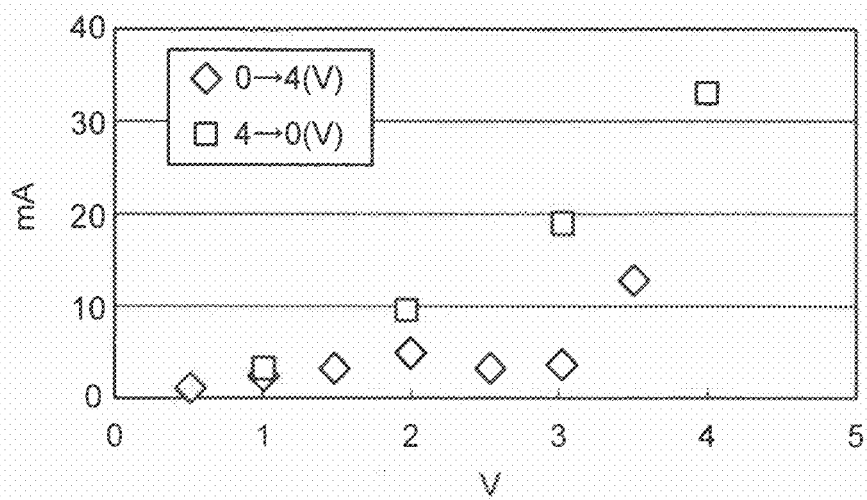
FIG. 6 is a graph showing a current-voltage characteristics of a circuit system including an electric element according to an embodiment.
Figure 7:
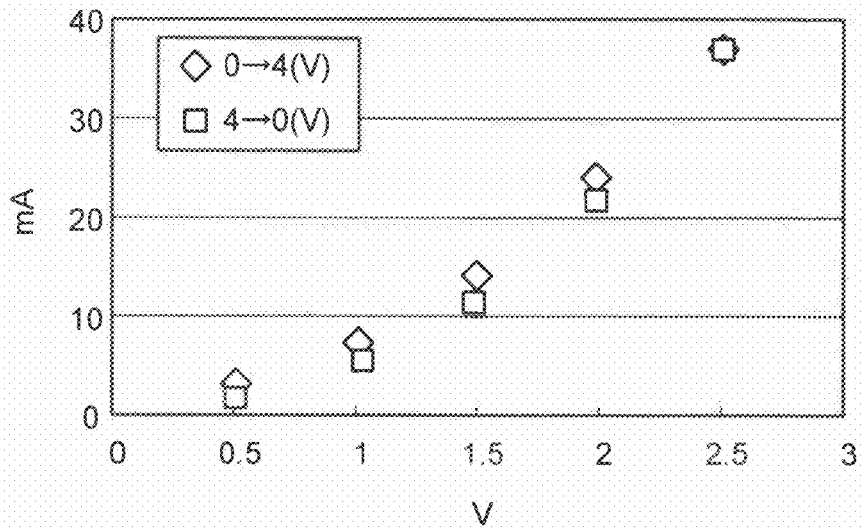
FIG. 7 is a graph showing a current-voltage characteristics of a circuit system including an electric element according to an embodiment.

First of all, an electric element and the principle of the electric element in this embodiment will be described. FIG. 1 is a structural view showing a circuit system including the electric element, and FIGS. 2 to 4 are SEM photographs showing the structure of carbon nanotubes constituting the electric element. FIGS. 5 to 7 are graphs showing current-voltage characteristics of the electric element based on the structures of the carbon nanotubes as shown in FIGS. 2 to 4, respectively.

The circuit system 10 shown in FIG. 1 includes an electric element 11, an ampere meter 12, an electric power supply 13 and a voltmeter 14. The electric element 11 is comprised of a pair of electrodes 111 and a plurality of carbon nanotubes 112 located between the electrodes 111.

One end of the ampere meter 12 is electrically connected with one of the electrodes 111 of the electric element 11 and the other end of the ampere meter 12 is grounded so that the ampere meter 12 can measure a current passing through the electric element 11. The electric power supply 13 is electrically connected with the other of the electrodes 111 of the electric element 11. Since the negative side of the electric power supply 13 is grounded, a positive voltage is applied to the electric element 11 from the electric power supply 13. The voltmeter 14 is electrically connected with the electric element 11 in parallel with the electric power supply 13 so as to measure the voltage to be applied to the electric element 11 from the electric power supply 13.

In the circuit system 10 shown in FIG. 1, if the carbon nanotubes 112 of the electric element 11 exhibits a three-dimensional network structure as shown in FIGS. 2 and 3, the electric element 11 can exhibit a specific current-voltage characteristics.

In the current-voltage characteristics shown in FIG. 5 corresponding to the structure of the carbon nanotubes 112 shown in FIG. 2, no current is flowed in the electric element 11 within a range of 2.5 V or less of the applying voltage, but current is flowed in the electric element 11 beyond 2.5 V of the applying voltage. Once the current is flowed in the electric element 11, the amount of the current becomes almost proportion to the amplitude of the applying voltage. Or the amount of the current is decreased as the applying voltage is decreased.

Similarly, in the current-voltage characteristics shown in FIG. 6 corresponding to the structure of the carbon nanotubes 112 shown in FIG. 3, no current is flowed in the electric element 11 within a range of 2.5 V or less of the applying voltage, but current is flowed in the electric element 11 beyond 2.5 V of the applying voltage. Once the current is flowed in the electric element 11, the amount of the current becomes almost proportion to the amplitude of the applying voltage. Or the amount of the current is decreased as the applying voltage is decreased.

On the other hand, if the carbon nanotubes 112 of the electric element 11 does not exhibit a three-dimensional network structure, but two-dimensional structure as shown in FIG. 4, the electric element 11 cannot exhibit a specific current-voltage characteristics. Namely, as shown in FIG. 7, the current-voltage characteristics exhibits a similar pattern (similar tendency) when the applying voltage is increased and decreased for the electric element 11.

In other words, in the case that the carbon nanotubes 112 of the electric element 11 exhibits the three-dimensional network structure, the electric element 11 can exhibit the specific hysteresis of the current-voltage characteristics when the applying voltage is increased and decreased for the electric element 11. Particularly, the electric element 11 has a critical voltage for current generation when the applying voltage is increased. Here, the critical voltage is 2.5 V in this embodiment.

That the electric element 11 has the critical voltage for current generation means that the electric element 11 has a relatively large resistance in the case of not more than the critical voltage and has a relatively small resistance in the case of more than the critical voltage. Concretely, the resistance of the electric element 11 is decreased beyond the critical voltage. In this point of view, if the difference between the resistance not more than the critical voltage and the resistance more than the critical voltage of the electric element 11 is utilized, the electric element 11 can be employed for various uses.

Here, the carbon nanotubes 112 are powdery. Namely, an appropriate amount of carbon nanotube powder is condensed, solidified and disposed as the carbon nanotubes 112 between the electrodes 111.

Each carbon nanotube may be configured as a single-layered carbon nanotube, two-layered carbon nanotube, multi-layered carbon nanotube, or a combination containing at least two of them listed above.

The length and diameter of each carbon nanotube is not limited only if the electric element 11 can exhibit the specific current-voltage characteristics, but may be set within a range of 5 to 25 μm and within a range of 2 to 20 nm, respectively.

US 2008/0070162 A1 teaches that the carbon material made of carbon with $sp^2$ hybrid orbital and $sp^3$ hybrid orbital is utilized as a recording material and that carbon nanotube is concretely exemplified as the recording material (i.e., the carbon material). However, since the carbon nanotube is formed by means of CVD, the thus obtained carbon nanotubes can normally exhibit only a two-dimensional structure. Therefore, since the carbon nanotubes according to US 2008/0070162 A1 can not exhibit a three-dimensional structure, the carbon nanotubes can not exhibit the same effect/function as the carbon nanotubes, that is, the electric element in this embodiment.

Moreover, JP-A 2008-166591 (KOKAI) teaches that transition metal or transition metal alloy is incorporated into a carbon nanotube to induce metal-insulator transition (Mott transition) and the difference in resistance before and after the application of voltage to the thus obtained carbon nanotubes is utilized to constitute a memory element. In JP-A 2008-166591 (KOKAI), however, since the transition metal or the like is incorporated into the carbon nanotube, the configuration of the thus obtained carbon nanotubes is different from the configuration of the carbon nanotubes in this embodiment. Moreover, in JP-A 2008-166591 (KOKAI), the memory element is operated using the difference in resistance before and after the application of voltage to the thus obtained carbon nanotubes. In contrast, in this embodiment, the electric element 11 is operated using the critical voltage when voltage is applied to the electric element 11. In this point of view, the operating principle of JP-A 2008-166591 (KOKAI) is also different from the operating principle of the electric element 11 in this embodiment. As a result, JP-A 2008-166591 (KOKAI) is quite different from this embodiment.

Referring to Electrochemistry 75, 4(2007)370 and the like, the carbon nanotube can be formed by means of arc discharge and laser ablation in addition to CVD. However, the document does not teach the formation of the carbon nanotube with three-dimensional structure.

(Application of Electric Element)

Then, the application of the electric element 11 will be described.

<Memory Element>

Figure 8:
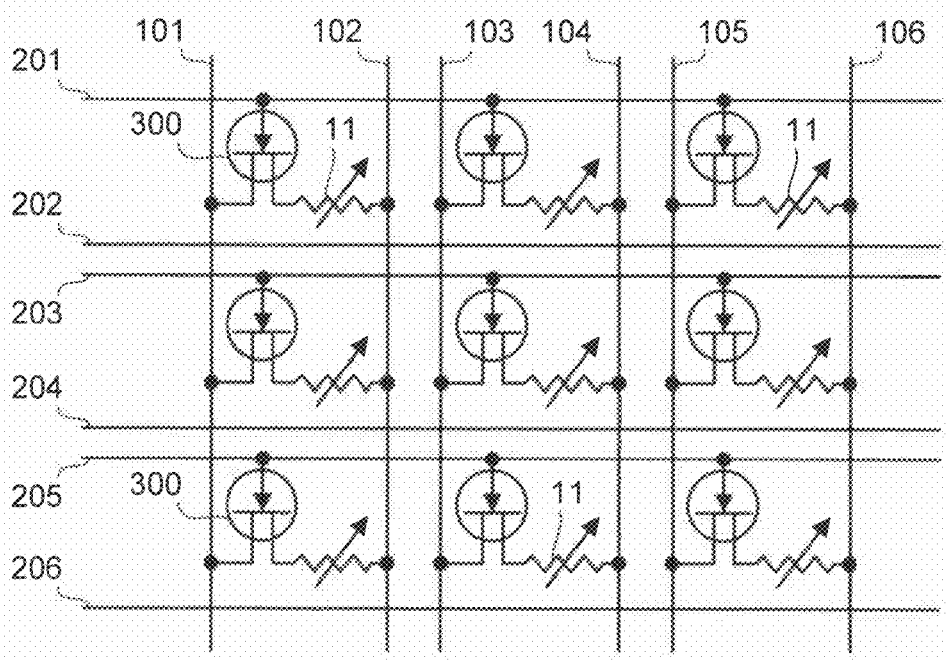
FIG. 8 is a structural view showing a memory matrix according to an embodiment.

FIG. 8 is a structural view showing a memory matrix using the electric element 11 for a memory element. This drawing shows a circuit configuration when the memory cells are arranged in an array. In the memory matrix shown in FIG. 8, bit lines 101 to 105 are arranged in a longitudinal direction and word lines 201 to 205 are arranged orthogonal to the bit lines 101 to 105.

For example, a switching transistor 300 is turned on by a bit line 101 and a word line 201 so that the memory element 11 as the electric element is selected uniquely in the region defined by the bit line 101 and the word line 201 so as to conduct memory operation.

For example, when a first voltage (e.g., more than 2.5 V) beyond the critical voltage of the memory element 11 as described above is applied to the memory element 11 via the bit lines 101 and 102, the resistance of the memory element 11 is decreased (first resistance). Therefore, data "1" is allotted to the first resistance, for example. On the other hand, when a second voltage (e.g., 2.5 V or less) not more than the critical voltage of the memory element 11 is applied to the memory element 11 via the bit lines 101 and 102, the resistance of the memory element 11 is increased (second resistance). Therefore, data "0" is allotted to the second resistance.

In this way, by allotting data "0" and "1" to the small resistance and the large resistance of the memory element 11, the memory operation can be conducted for the memory element 11 using the resistance change.

The data "0" may be allotted to the first resistance and the data "1" may be allotted to the second resistance.

In this embodiment, the memory operation for the memory element 11 in the region defined by the bit line 101 and the word line 201 is described, but the memory operation can be applied to the memory element 11 in another region defined by another bit line and another word line.

As apparent from the above description, the electric element can be applied as a nonvolatile memory element.

If an external high resistance (not shown) is connected with the electric element, the electric element, that is, the nonvolatile memory element can be applied as a WORM (Write Once Read Memory). Namely, in overwriting process, although an extremely large voltage is needed to be applied to the nonvolatile memory element due to the external high resistance, such an extremely large voltage can not be substantially applied to the nonvolatile memory element.

Figure 9:
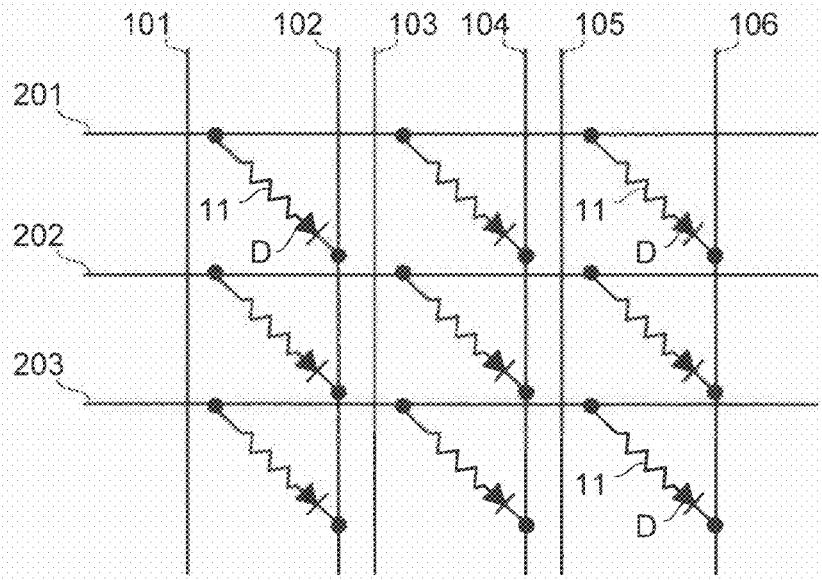
FIG. 9 is another structural view showing a memory matrix according to an embodiment.

FIG. 9 is another structural view showing a memory matrix using the electric element 11 for a memory element. This drawing also shows a circuit configuration when the memory cells are arranged in an array. In the memory matrix shown in FIG. 9, the bit lines 101 to 105 are arranged in a longitudinal direction and the word lines 201 to 205 are arranged orthogonal to the bit lines 101 to 105 in the same manner as shown in FIG. 8.

For example, by selecting the bit line 101 and the word line 201, the memory element 11 as the electric element is uniquely selected in the region defined by the bit line 101 and the word line 201 to conduct the memory operation for the memory element 11. In the memory matrix of this embodiment, diodes D are electrically connected in series with the memory elements 11, respectively, so that no voltage can not be applied to other memory elements except the memory element 11 to be operated.

In this embodiment, when a first voltage (e.g., more than 2.5 V) beyond the critical voltage of the memory element 11 as described above is applied to the selected memory element 11 via the bit lines 101 and 102, the resistance of the memory element 11 is decreased (first resistance). Therefore, data "1" is allotted to the first resistance, for example. On the other hand, when a second voltage (e.g., 2.5 V or less) not more than the critical voltage of the memory element 11 is applied to the selected memory element 11 via the bit lines 101 and 102, the resistance of the memory element 11 is increased (second resistance). Therefore, data "0" is allotted to the second resistance.

In this way, by allotting data "0" and "1" to the small resistance and the large resistance of the memory element 11, the memory operation can be conducted for the selected memory element 11 using the resistance change.

The data "0" may be allotted to the first resistance and the data "1" may be allotted to the second resistance.

In this embodiment, the memory operation for the memory element 11 in the region defined by the bit line 101 and the word line 201 is described, but the memory operation can be applied to the memory element 11 in another region defined by another bit line and another word line in the same manner as the embodiment related to FIG. 8.

As apparent from the above description, the electric element can be applied as a nonvolatile memory element in the memory matrix shown in FIG. 9.

In this embodiment, too, if an external high resistance (not shown) is connected with the electric element, the electric element, that is, the nonvolatile memory element can be applied as a WORM (Write Once Read Memory). Namely, in overwriting process, although an extremely large voltage is needed to be applied to the nonvolatile memory element due to the external high resistance, such an extremely large voltage can not be substantially applied to the nonvolatile memory element.

<Switching Element>

Figure 10:
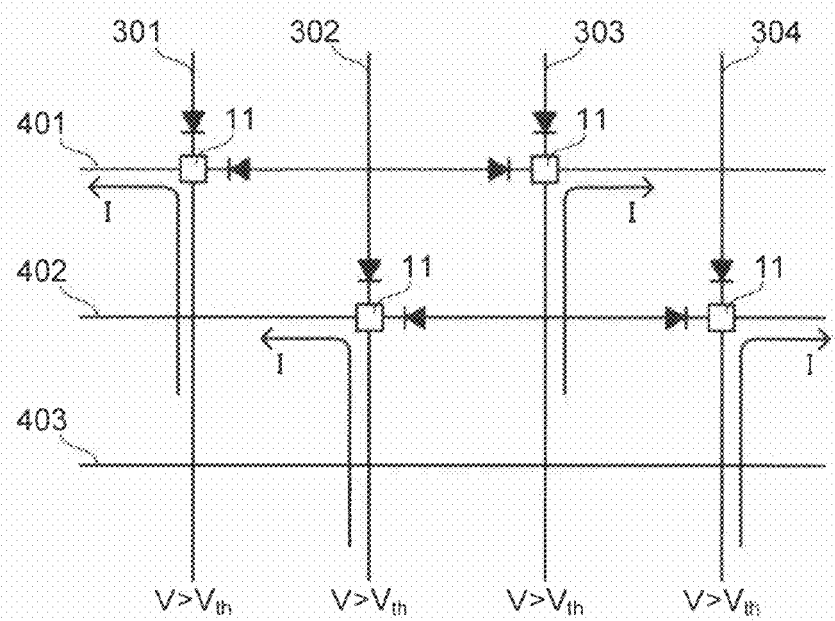
FIG. 10 is a circuit diagram of a switching element according to an embodiment.

FIG. 10 is a circuit diagram of a switching element including the electric element 11. In the circuit diagram, four electric wires 301 to 304 are arranged in a longitudinal direction and three electric wires are arranged in a transverse direction so as to be orthogonal to the electric wires 301 to 304.

As shown in FIG. 10, in this embodiment, the switching elements 11 as the electric elements are arranged at the cross points of the electric wires 301 and 401, the electric wires 302 and 402, the electric wires 303 and 401, the electric wires 304 and 402. Then, the diodes D are disposed in the up and down sides and in the left and right sides of the switching elements 11. Therefore, when one or more of the switching elements 11 are selected and operated, no current is flowed in another direction different from the intended direction.

In order to operate the switching element(s) as the electric element(s), a large voltage beyond the critical voltage (designated by "Vth" in FIG. 10) is applied to the switching element(s) 11.

For example, when a large voltage "V" beyond the critical voltage Vth is applied to the bottom end of the electric wire 301, the resistance of the switching element 11 disposed at the cross point of the electric wires 301 and 401 is decreased so that current is flowed in the switching element 11. Namely, the switching element is turned on to flow the current therein. In this case, since the diodes D are disposed in the up side and in the right side of the switching element 11, no current is flowed in the up direction and the right direction of the switching element 11. Namely, when the switching element 11 disposed at the cross point of the electric wires 301 and 401 is turned on, the current "I" is flowed from the bottom of the electric wire 301 to the left of the electric wire 401 through the switching element 11.

Moreover, when the voltage "V" beyond the critical voltage Vth is applied to the bottom end of the electric wire 302, the resistance of the switching element 11 disposed at the cross point of the electric wires 302 and 402 is decreased so that current is flowed in the switching element 11. Namely, the switching element is turned on to flow the current therein. In this case, since the diodes D are disposed in the up side and in the right side of the switching element 11, no current is flowed in the up direction and the right direction of the switching element 11. Namely, when the switching element 11 disposed at the cross point of the electric wires 301 and 401 is turned on, the current "I" is flowed from the bottom of the electric wire 302 to the left of the electric wire 402 through the switching element 11.

When the voltage "V" is applied to the bottom ends of the electric wire 303 or 304, the switching element 11 is turned on to flow the current "I" in the same manner as the above-described embodiments though the direction of the current "I" becomes different due to the different dispositions of the diodes D In order to turn the switching element 11 off, the voltage "V" to be applied to the bottom end of the electric wire 301 is set smaller than the critical voltage "Vth". In this case, since the resistance of the switching element 11 is maintained higher, no current is flowed in the switching element 11 so that the switching element 11 is turned off.

Although the present invention was described in detail with reference to the above examples, this invention is not limited to the above disclosure and every kind of variation and modification may be made without departing from the scope of the present invention.

For example, the structure of a memory matrix as shown in FIGS. 8 and 9 may be modified as desired and then, the structure of a circuit including switching elements as shown in FIG. 10 may be modified as desired.

What is claimed is:

1. An electric element, comprising:
  a pair of electrodes; and
  a plurality of powder-condensed and solidified carbon nanotubes of three-dimensional network structure which are located between the pair of electrodes.
2. The electric element as set forth in claim 1,
  wherein the electric element exhibits different hysteresis curves in current-voltage characteristics when an applying voltage is increased and decreased,
  wherein the electric element has a critical voltage related to current generation originated from the applying voltage when the applying voltage is increased.
3. The electric element as set forth in claim 2,
  wherein an amount of current flowed in the electric element becomes proportional to an amplitude of voltage to be applied to the electric element within a range of more than the critical voltage.
4. A switching element comprising an electric element as set forth in claim 1.
5. The switching element as set forth in claim 4,
  further comprising rectifying elements in at least two sides of up and down sides and left and right sides of the switching element.
6. A memory element comprising an electric element as set forth in claim 1.
7. The memory element as set forth in claim 5,
  further comprising an external resistance electrically connected with the electric element so that data stored in the memory element through an application of a voltage can not be rewritten.
8. A switching method, comprising:
  disposing a plurality of powder-condensed and solidified carbon nanotubes of three-dimensional network structure between a pair of electrodes to form an electric element;
  applying a first voltage beyond a critical voltage related to current generation to the electric element so as to turn the electric element on during voltage application to the electric element; and
  applying a second voltage not more than the critical voltage to the electric element so as to turn the electric element off under the condition of no current during another voltage application to the electric element.
9. The switching method as set forth in claim 8,
  further comprising rectifying a current generated by providing rectifying elements in at least two sides of up and down sides and left and right sides of a switching element including the electric element when applying the first voltage beyond the critical voltage to the electric element.
10. A memory method, comprising:
  disposing a plurality of powder-condensed and solidified carbon nanotubes of three-dimensional network structure between a pair of electrodes to form an electric element;
  applying a first voltage beyond a critical voltage related to current generation to the electric element so as to render a resistance of the electric element a first state during voltage application to the electric element;
  applying a second voltage not more than the critical voltage to the electric element so as to render the resistance of the electric element a second state during another voltage application to the electric element; and
  allotting data to the first state and the second state of the resistance of the electric element, respectively.
11. The memory method as set forth in claim 10,
  further comprising electrically connecting an external resistance with the electric element so that the data allotted to the first state and the second state of the resistance can not be rewritten.

* * * * *